US010721817B2

(12) United States Patent
Takano et al.

(10) Patent No.: US 10,721,817 B2
(45) Date of Patent: Jul. 21, 2020

(54) RESIN COMPOSITION, PREPREG OR RESIN SHEET COMPRISING THE RESIN COMPOSITION, AND LAMINATE AND PRINTED CIRCUIT BOARD COMPRISING THEM

(71) Applicant: MITSUBISHI GAS CHEMICAL COMPANY, INC., Tokyo (JP)

(72) Inventors: Yoichi Takano, Tokyo (JP); Nobuyoshi Ohnishi, Tokyo (JP); Hiroshi Takahashi, Tokyo (JP); Eisuke Shiga, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 197 days.

(21) Appl. No.: 15/737,498

(22) PCT Filed: Jul. 4, 2016

(86) PCT No.: PCT/JP2016/069737
§ 371 (c)(1),
(2) Date: Dec. 18, 2017

(87) PCT Pub. No.: WO2017/006887
PCT Pub. Date: Jan. 12, 2017

(65) Prior Publication Data
US 2018/0177047 A1  Jun. 21, 2018

(30) Foreign Application Priority Data

Jul. 6, 2015 (JP) .................. 2015-135196

(51) Int. Cl.
| | | |
|---|---|---|
| C08L 45/00 | (2006.01) | |
| H05K 1/03 | (2006.01) | |
| C08J 5/24 | (2006.01) | |
| C08F 267/10 | (2006.01) | |
| C08G 73/00 | (2006.01) | |
| C08F 222/40 | (2006.01) | |
| C08F 34/00 | (2006.01) | |
| C08G 73/12 | (2006.01) | |
| C08G 77/26 | (2006.01) | |
| C08G 81/02 | (2006.01) | |
| C08L 39/04 | (2006.01) | |
| C08L 79/08 | (2006.01) | |
| C08L 83/08 | (2006.01) | |

(52) U.S. Cl.
CPC .......... *H05K 1/0353* (2013.01); *C08F 34/00* (2013.01); *C08F 222/40* (2013.01); *C08F 267/10* (2013.01); *C08G 73/00* (2013.01); *C08G 73/12* (2013.01); *C08G 77/26* (2013.01); *C08G 81/024* (2013.01); *C08J 5/24* (2013.01); *C08L 39/04* (2013.01); *C08L 45/00* (2013.01); *C08L 79/085* (2013.01); *C08L 83/08* (2013.01); *H05K 1/03* (2013.01); *C08J 2400/24* (2013.01)

(58) Field of Classification Search
None
See application file for complete search history.

(56) References Cited

U.S. PATENT DOCUMENTS

| | | | | |
|---|---|---|---|---|
| 5,006,614 A * | 4/1991 | Itoh ..................... | C08G 59/08 |
| | | | 523/443 |
| 5,087,766 A * | 2/1992 | Kanayama ............ | C07C 37/055 |
| | | | 568/718 |
| 5,290,882 A * | 3/1994 | Shiobara ............. | C08G 59/3218 |
| | | | 523/429 |
| 5,300,588 A * | 4/1994 | Shiobara ............... | C08L 79/085 |
| | | | 525/422 |
| 5,340,851 A * | 8/1994 | Shiobara ............. | C08G 59/4042 |
| | | | 257/E23.119 |
| 5,856,425 A * | 1/1999 | Rosenfeld .............. | C08G 73/12 |
| | | | 528/289 |
| 8,932,705 B2 * | 1/2015 | Cho ........................ | C08K 7/28 |
| | | | 428/313.3 |
| 2003/0148106 A1 * | 8/2003 | Ma .......................... | B24D 3/28 |
| | | | 428/411.1 |
| 2007/0270568 A1 * | 11/2007 | Ushiki ................. | C08F 226/02 |
| | | | 528/170 |
| 2009/0017316 A1 | 1/2009 | Kato et al. | |
| 2010/0178501 A1 * | 7/2010 | Masuko .................... | C09J 4/06 |
| | | | 428/355 N |
| 2011/0187009 A1 * | 8/2011 | Masuko ............. | C08G 73/1042 |
| | | | 257/798 |
| 2011/0194261 A1 | 8/2011 | Tanaka et al. | |
| 2012/0256326 A1 * | 10/2012 | Mitsukura ........... | H01L 21/6836 |
| | | | 257/798 |

(Continued)

FOREIGN PATENT DOCUMENTS

| | | |
|---|---|---|
| CN | 104736588 A | 6/2015 |
| JP | H03-221526 A | 9/1991 |

(Continued)

OTHER PUBLICATIONS

Data sheet for Shin Etsu, 1 page, 2019. (Year: 2019).*
International Search Report Patent from Application No. PCT/JP2016/069737, dated Sep. 20, 2016.
International Preliminary Report on Patentability from Patent Application No. PCT/JP2016/069737, dated Jan. 9, 2018.

*Primary Examiner* — Robert S Loewe

(74) *Attorney, Agent, or Firm* — Greenblum & Bernstein, P.L.C.

(57) ABSTRACT

The resin composition of the present invention comprises a prepolymer (P) and a thermosetting component, the prepolymer (P) being obtained by polymerizing an alkenyl-substituted nadimide (A), a maleimide compound (B), and an amino-modified silicone (C).

10 Claims, No Drawings

(56) References Cited

U.S. PATENT DOCUMENTS

| | | | | |
|---|---|---|---|---|
| 2012/0263946 | A1* | 10/2012 | Mitsukura | H01L 21/67132 |
| | | | | 428/345 |
| 2013/0157061 | A1* | 6/2013 | Sogame | B32B 27/38 |
| | | | | 428/418 |
| 2015/0267047 | A1 | 9/2015 | Takahashi et al. | |
| 2016/0309582 | A1* | 10/2016 | Tomizawa | B32B 15/08 |

FOREIGN PATENT DOCUMENTS

| | | |
|---|---|---|
| JP | H04-236228 A | 8/1992 |
| JP | H07-179816 A | 7/1995 |
| JP | 3173332 B2 | 6/2001 |
| JP | 2009-035728 A | 2/2009 |
| JP | 2011-178992 A | 9/2011 |
| JP | 2012-081586 | 4/2012 |
| JP | 2013-001807 A | 1/2013 |
| JP | 2013-127022 A | 6/2013 |
| JP | 2013-187376 A | 9/2013 |
| JP | 2013-216884 A | 10/2013 |
| JP | 2014012751 A * | 1/2014 ............ C08L 83/08 |

\* cited by examiner

RESIN COMPOSITION, PREPREG OR RESIN SHEET COMPRISING THE RESIN COMPOSITION, AND LAMINATE AND PRINTED CIRCUIT BOARD COMPRISING THEM

TECHNICAL FIELD

The present invention relates to a resin composition, a prepreg or a resin sheet comprising the resin composition, a laminate comprising the prepreg or the resin sheet, a printed circuit board comprising the resin composition, and a method for producing the resin composition.

BACKGROUND ART

The high integration or high-density packaging of each component for semiconductor packages has been increasingly accelerated in recent years as semiconductor packages widely used in electronics, communication devices, personal computers, etc. have been more highly functionalized or miniaturized. Along with this, the difference in the coefficient of thermal expansion between a semiconductor device and a printed circuit board for semiconductor plastic packages causes the undesired warpage of semiconductor plastic packages. Various measures against this problem have been attempted.

One example of the measures includes reduction in thermal expansion of insulating layers for use in printed circuit boards. This approach is to suppress the warpage by bringing the coefficient of thermal expansion of a printed circuit board closer to the coefficient of thermal expansion of a semiconductor device and is currently being actively tackled (see e.g., Patent Documents 1 to 3).

In addition to the reduction in thermal expansion of printed circuit boards, increase in the rigidity of laminates (high rigidity) or increase in the glass transition temperatures of laminates (high Tg) has been studied as an approach for suppressing the warpage of semiconductor plastic packages (see e.g., Patent Documents 4 and 5).

LIST OF PRIOR ART DOCUMENTS

Patent Document

Patent Document 1: Japanese Patent Laid-Open No. 2013-216884
Patent Document 2: Japanese Patent No. 3173332
Patent Document 3: Japanese Patent Laid-Open No. 2009-035728
Patent Document 4: Japanese Patent Laid-Open No. 2013-001807
Patent Document 5: Japanese Patent Laid-Open No. 2011-178992

SUMMARY OF INVENTION

Problems to be Solved by Invention

The reduction in thermal expansion or the high rigidity of laminates as mentioned above is achieved by highly incorporating fillers into resin compositions for use in laminates. The problems of these approaches, however, are that such high incorporating of fillers reduces the peel strength of the laminates against metal foils (metal foil peel strength).

Furthermore, laminates are exposed to a chemical solution in an etching step, a desmear step, a plating step, and the like. Therefore, if the laminates have low chemical resistance, the steps are contaminated so that the quality or productivity of products is disadvantageously deteriorated. Particularly, in the desmear step, a strongly alkaline washing solution is used for the purpose of removing smears caused by mechanical drill or laser drill. Therefore, if the laminates have insufficient chemical resistance, the inner walls of through-holes or the surface of other resin layers is eluted in addition to smears, and as a result, the undesired contamination of the laminates becomes pronounced (desmear resistance).

As mentioned above, the preparation of printed circuit boards requires excellent metal foil peel strength and desmear resistance. However, it is difficult to achieve both of these properties at a high level, and there is still room for improvement.

Accordingly, an object of the present invention is to provide a resin composition capable of achieving both of metal foil peel strength and desmear resistance at a high level, for example, in the preparation of printed circuit boards.

Means for Solving Problems

The present inventors have conducted diligent studies to attain the object and consequently found that a resin composition comprising a prepolymer (P) composed of particular components and a thermosetting component is capable of achieving both of metal foil peel strength and desmear resistance at a high level in the preparation of printed circuit boards, reaching the present invention.

Specifically, the present invention relates to the following:

[1]

A resin composition comprising a prepolymer (P) and a thermosetting component, the prepolymer (P) being obtained by polymerizing an alkenyl-substituted nadimide (A), a maleimide compound (B), and an amino-modified silicone (C).

[2]

The resin composition according to [1], wherein the thermosetting component comprises an alkenyl-substituted nadimide (A) and/or a maleimide compound (B).

[3]

The resin composition according to [1] or [2], wherein the alkenyl-substituted nadimide (A) comprises a compound represented by following general formula (1):

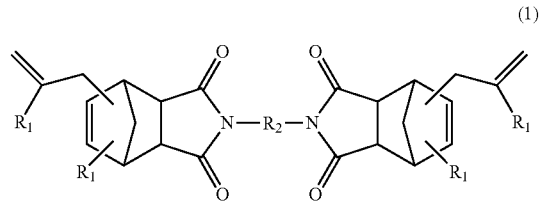

(1)

wherein each $R_1$ independently represents a hydrogen atom or an alkyl group having 1 to 6 carbon atoms, and represents an alkylene group having 1 to 6 carbon atoms, a phenylene group, a biphenylene group, a naphthylene group, or a group represented by following general formula (2) or (3):

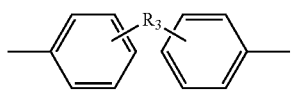
(2)

wherein $R_3$ represents a methylene group, an isopropylidene group, or a substituent represented by CO, O, S, or $SO_2$, and

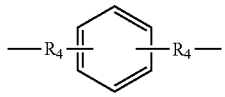
(3)

wherein each $R_4$ independently represents an alkylene group having 1 to 4 carbon atoms, or a cycloalkylene group having 5 to 8 carbon atoms.

[4]

The resin composition according to any of [1] to [3], wherein the alkenyl-substituted nadimide (A) comprises a compound represented by the following formula (4) and/or a compound represented by the following formula (5):

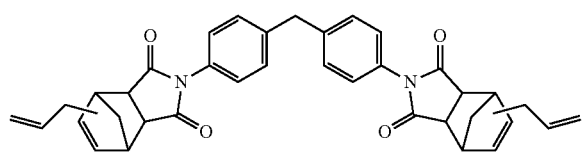
(4)

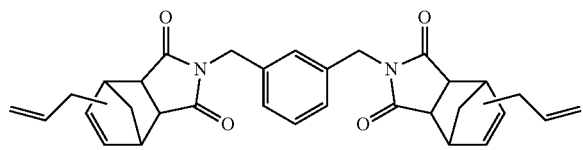
(5)

[5]

The resin composition according to any of [1] to [4], wherein the maleimide compound (B) is at least one compound selected from the group consisting of bis(4-maleimidophenyl)methane, 2,2-bis{4-(4-maleimidophenoxy)-phenyl}propane, bis(3-ethyl-5-methyl-4-maleimidophenyl)methane, polytetramethylene oxide-bis(4-maleimidobenzoate) and a maleimide compound represented by following general formula (6):

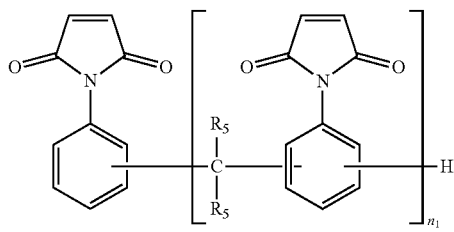
(6)

wherein each $R_5$ independently represents a hydrogen atom or a methyl group, and $n_1$ represents an integer of 1 or larger.

[6]

The resin composition according to any of [1] to [5], wherein the amino-modified silicone (C) comprises a compound represented by following general formula (Y):

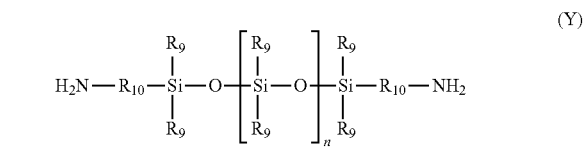
(Y)

wherein each $R_9$ independently represents a hydrogen atom, a methyl group, or a phenyl group, each $R_{10}$ independently represents an alkylene group having 1 to 10 carbon atoms and optionally having a side chain, and n represents an integer of 0 or larger.

[7]

The resin composition according to any of [1] to [6], further comprising an inorganic filler (D).

[8]

The resin composition according to [7], wherein the inorganic filler (D) comprises at least one selected from the group consisting of silica, alumina, and aluminum nitride.

[9]

The resin composition according to [7] or [8], wherein the content of the inorganic filler (D) is 50 to 500 parts by mass based on 100 parts by mass in total of the prepolymer (P) and the thermosetting component.

[10]

A prepreg comprising a base material impregnated or coated with the resin composition according to any of [1] to [9].

[11]

The prepreg according to [10], wherein the base material is at least one material selected from the group consisting of E glass cloth, T glass cloth, S glass cloth, Q glass cloth, and an organic fiber.

[12]

A resin sheet comprising a support coated with the resin composition according to any of [1] to [9].

[13]

A laminate comprising a cured product of a laminated body comprising one or more layers of at least one selected from the group consisting of the prepreg according to [10] or [11] and the resin sheet according to [12].

[14]

A metal foil-clad laminate comprising a cured product of a laminated body comprising a metal foil laminated with at least one selected from the group consisting of the prepreg according to [10] or [11] and the resin sheet according to [12].

[15]

A printed circuit board comprising an insulating layer and a conductor layer formed on a surface of the insulating layer, wherein the insulating layer comprises the resin composition according to any of [1] to [9].

[16]

A method for producing a resin composition, comprising steps of:
obtaining a prepolymer (P) by polymerizing an alkenyl-substituted nadimide (A), a maleimide compound (B), and an amino-modified silicone (C); and
mixing the obtained prepolymer (P) with a thermosetting component.

Advantages of Invention

The resin composition of the present invention can achieve both of excellent metal foil peel strength and desmear resistance at a high level, for example, in the preparation of printed circuit boards.

MODE FOR CARRYING OUT INVENTION

Hereinafter, the mode for carrying out the present invention (hereinafter, also referred to as the "present embodiment") will be described. The embodiments below are given for illustrating the present invention, and the present invention is not intended to be limited by these embodiments.

[Resin Composition]

The resin composition of the present embodiment comprises a prepolymer (P) and a thermosetting component, the prepolymer (P) being obtained by polymerizing an alkenyl-substituted nadimide (A), a maleimide compound (B), and an amino-modified silicone (C).

In the resin composition of the present embodiment, the content of the prepolymer (P) is preferably 10 to 90% by mass, more preferably 30 to 80% by mass, further preferably 40 to 70% by mass.

In the resin composition of the present embodiment, the content of the thermosetting component is preferably 10 to 90% by mass, more preferably 20 to 70% by mass, further preferably 30 to 60% by mass.

Examples of the thermosetting component include, but are not particularly limited to, alkenyl-substituted nadimides (A), maleimide compounds (B), cyanic acid ester compounds, epoxy resins, benzoxazine compounds, and phenol resins. These thermosetting components may be used singly or in combinations of two or more thereof. Among them, an alkenyl-substituted nadimide (A) and/or a maleimide compound (B) is preferably comprised as the thermosetting component.

Hereinafter, the resin composition will be described in detail.

[Alkenyl-Substituted Nadimide (A)]

The alkenyl-substituted nadimide (A) used in the present embodiment is not particularly limited as long as the compound has one or more alkenyl-substituted nadimide groups in the molecule. Specific examples thereof include a compound represented by following general formula (1):

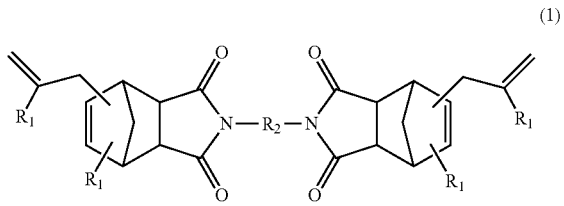

(1)

In the formula (1), each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by following general formula (2) or (3):

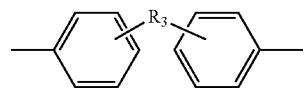

(2)

In the formula (2), $R_3$ represents a methylene group, an isopropylidene group, or a substituent represented by CO, O, S, or $SO_2$.

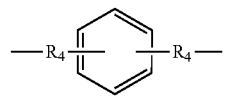

(3)

In the formula (3), each $R_4$ is independently selected and represents an alkylene group having 1 to 4 carbon atoms, or a cycloalkylene group having 5 to 8 carbon atoms.

A commercially available product can also be used as the alkenyl-substituted nadimide (A) represented by the formula (1). Examples of the commercially available product include, but are not particularly limited to, a compound represented by the formula (4) given below (BANI-M (manufactured by Maruzen Petrochemical Co., Ltd.)), and a compound represented by the formula (5) given below (BANI-X (manufactured by Maruzen Petrochemical Co., Ltd.)). These compounds may be used singly or in combinations of two or more thereof.

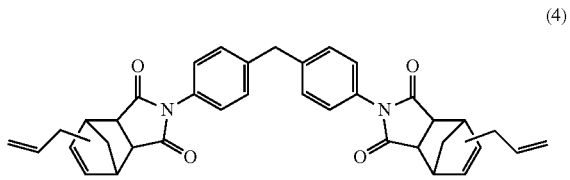

(4)

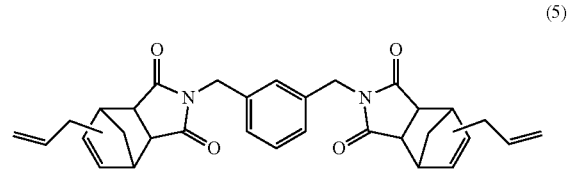

(5)

In the resin composition of the present embodiment, the content of the alkenyl-substituted nadimide (A) may be determined according to the ratio of the number of functional group between the number of alkenyl groups (a) (one of the functional groups) in the alkenyl-substituted nadimide (A) and the number of maleimide groups ((3) in the maleimide compound [β/α] as mentioned later. The content of the alkenyl-substituted nadimide (A) is preferably 10 to 60 parts by mass, more preferably 15 to 50 parts by mass, further preferably 20 to 40 parts by mass, based on 100 parts by mass in total of the prepolymer (P) and the thermosetting component. When the content of the component (A) falls within such a range, the resulting printed circuit board can be excellent in moldability even with a filler, and be excellent in curability, elastic modulus under heat (e.g., flexural modulus at 250° C. and flexural modulus at a solder reflow temperature), desmear resistance, and chemical resistance.

In the case of using an alkenyl-substituted nadimide (A) as the thermosetting component in the resin composition of the present embodiment, the alkenyl-substituted nadimide (A) used as a starting material for the prepolymer (P) (hereinafter, also referred to as an "alkenyl-substituted nadimide (A-1)"), and the alkenyl-substituted nadimide (A) used as the thermosetting component (hereinafter, also referred to as an "alkenyl-substituted nadimide (A-2)") may be the same or different.

In the case of using the alkenyl-substituted nadimides (A-1) and (A-2) in the resin composition of the present embodiment, the mass ratio of the alkenyl-substituted nadimide (A-1) to the whole alkenyl-substituted nadimide (A) ((A-1)/(A)) is preferably 0.1 to 1.0, more preferably 0.5 to 1.0, further preferably 0.8 to 1.0. When the mass ratio between the alkenyl-substituted nadimides (A-1) and (A) falls within such a range, the resulting printed circuit board can be excellent in metal foil peel strength and desmear resistance.

The ratio of the number of maleimide groups (β) in the maleimide compound (B) to the number of alkenyl groups (α) in the alkenyl-substituted nadimide (A) [β/α] mentioned above is preferably 0.9 to 4.3, more preferably 1.5 to 4.0, further preferably 1.5 to 3.0.

[Maleimide Compound (B)]

The maleimide compound (B) used in the present embodiment is not particularly limited as long as the compound has one or more maleimide groups in the molecule. Specific examples thereof include N-phenylmaleimide, N-hydroxyphenylmaleimide, bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, polytetramethylene oxide-bis(4-maleimidobenzoate), a maleimide compound represented by the formula (6) given below, prepolymers of these maleimide compounds, and prepolymers of the maleimide compounds and amine compounds. These compounds may be used singly or in a form of a suitable mixture of two or more thereof.

Among them, bis(4-maleimidophenyl)methane, 2,2-bis{4-(4-maleimidophenoxy)-phenyl}propane, bis(3-ethyl-5-methyl-4-maleimidophenyl)methane, polytetramethylene oxide-bis(4-maleimidobenzoate), or a maleimide compound represented by following general formula (6) is preferred, and a maleimide compound represented by following general formula (6) is particularly preferred. The resin composition comprises such a maleimide compound (B), whereby there is a tendency to bring about reduction in coefficient of thermal expansion, improvement in glass transition temperature, improvement in heat resistance, and improvement in elastic modulus under heat to the resulting cured product.

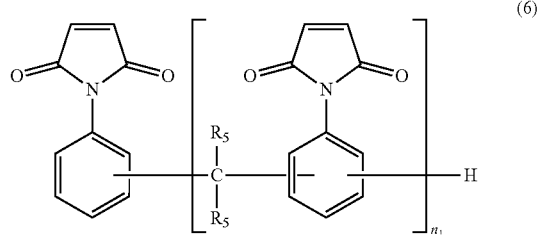

(6)

In the formula (6), each $R_5$ independently represents a hydrogen atom or a methyl group and is particularly preferably a hydrogen atom.

In the formula, $n_1$ represents an integer of 1 or larger. The upper limit of $n_1$ is preferably 10, more preferably 7.

In the resin composition of the present embodiment, the content of the maleimide compound (B) may be determined according to the ratio between the number of alkenyl groups in the alkenyl-substituted nadimide (A) and the number of maleimide groups in the maleimide compound (B) mentioned above, and is preferably 30 to 80 parts by mass, more preferably 35 to 70 parts by mass, further preferably 40 to 60 parts by mass, based on 100 parts by mass in total of the prepolymer (P) and the thermosetting component. When the content of the component (B) falls within such a range, the resulting printed circuit board can be excellent in moldability even with a filler, and be excellent in curability, elastic modulus under heat, desmear resistance, and chemical resistance.

In the case of using a maleimide compound (B) as the thermosetting component in the resin composition of the present embodiment, the maleimide compound (B) used as a starting material for the prepolymer (P) (hereinafter, also referred to as a "maleimide compound (B-1)"), and the maleimide compound (B) used as the thermosetting component (hereinafter, also referred to as a "maleimide compound (B-2)") may be the same or different and are preferably different.

The maleimide compound (B-1) is preferably bis(4-maleimidophenyl)methane, 2,2-bis{4-(4-maleimidophenoxy)-phenyl}propane, bis(3-ethyl-5-methyl-4-maleimidophenyl)methane, polytetramethylene oxide-bis(4-maleimidobenzoate), or a maleimide compound represented by the general formula (6), more preferably 2,2-bis{4-(4-maleimidophenoxy)-phenyl}propane or bis(3-ethyl-5-methyl-4-maleimidophenyl)methane, further preferably 2,2-bis{4-(4-maleimidophenoxy)-phenyl}propane.

The maleimide compound (B-2) is preferably bis(4-maleimidophenyl)methane, 2,2-bis{4-(4-maleimidophenoxy)-phenyl}propane, bis(3-ethyl-5-methyl-4-maleimidophenyl)methane, polytetramethylene oxide-bis(4-maleimidobenzoate), or a maleimide compound represented by the general formula (6), more preferably bis(3-ethyl-5-methyl-4-maleimidophenyl)methane, polytetramethylene oxide-bis(4-maleimidobenzoate), or a maleimide compound represented by the general formula (6), further preferably a maleimide compound represented by the general formula (6).

These maleimide compounds (B-1) or (B-2) may be used singly or may be used in combinations of two or more thereof.

In the resin composition of the present embodiment, in the case of using the maleimide compounds (B-1) and (B-2), the content of the maleimide compound (B-1) is determined by the number of amino groups in the amino-modified silicone (C). Specifically, the ratio of the number of maleimide groups in the maleimide compound (β-1) to the number of amino groups (γ) in the amino-modified silicone (C) [β-1/γ] is preferably 1.0 to 20.0, more preferably 4.0 to 15.0, further preferably 6.0 to 12.0. The content of the maleimide compound (B-2) is preferably the difference between the content of the maleimide compound (B) and the content of the maleimide compound (B-1) ([(B−(B-1)]). When the contents of the maleimide compounds (B-1) and (B-2) fall within such ranges, the resulting printed circuit board can be excellent in metal foil peel strength and desmear resistance.

[Amino-Modified Silicone (C)]

The amino-modified silicone (C) used in the present embodiment is not particularly limited as long as the compound has one or more amino groups in the molecule. Specific examples thereof include a compound represented by following general formula (Y):

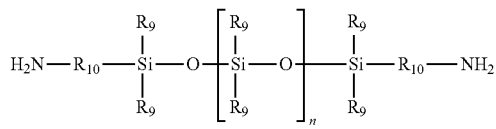

(Y)

In the formula (Y), each $R_9$ independently represents a hydrogen atom, a methyl group, or a phenyl group and is particularly preferably a methyl group. In the formula (Y), each $R_{10}$ independently represents an alkylene group having 1 to 10 carbon atoms and optionally having a side chain and is particularly preferably an alkylene group having 2 to 10 carbon atoms. In the formula (Y), n represents an integer of 0 or larger.

The amino group equivalent of the amino-modified silicone (C) is preferably 130 to 6000, more preferably 400 to 3000, further preferably 600 to 2500. By use of such an amino-modified silicone (C), the resulting printed circuit board can be excellent in metal foil peel strength and desmear resistance.

In the resin composition of the present embodiment, the content of the amino-modified silicone (C) is preferably 1 to 40 parts by mass, more preferably 3 to 30 parts by mass, further preferably 5 to 20 parts by mass, based on 100 parts by mass in total of the prepolymer (P) and the thermosetting component. When the content of the component (C) falls within such a range, the resulting printed circuit board can be excellent in metal foil peel strength and desmear resistance.

The resin composition of the present embodiment may comprise an epoxy resin. When the resin composition comprises an epoxy resin, the epoxy resin is not particularly limited as long as the compound has two or more epoxy groups in one molecule. Examples thereof include bisphenol A-based epoxy resins, bisphenol E-based epoxy resins, bisphenol F-based epoxy resins, bisphenol S-based epoxy resins, phenol novolac-based epoxy resins, bisphenol A novolac-based epoxy resins, cresol novolac-based epoxy resins, biphenyl-based epoxy resins, naphthalene-based epoxy resins, naphthylene ether-based epoxy resins, trifunctional phenol-based epoxy resins, tetrafunctional phenol-based epoxy resins, glycidyl ester-based epoxy resins, phenol aralkyl-based epoxy resins, biphenyl aralkyl-based epoxy resins, biphenyl novolac-based epoxy resins, aralkyl novolac-based epoxy resins, naphthol aralkyl-based epoxy resins, dicyclopentadiene-based epoxy resins, polyol-based epoxy resins, isocyanurate ring-containing epoxy resins, and halides thereof. Among them, a naphthylene ether-based epoxy resin or a biphenyl aralkyl-based epoxy resin is more preferred from the viewpoint of glass transition temperature and heat resistance. These epoxy resins may be used singly or in combinations of two or more thereof.

The content of the epoxy resin is not particularly limited and is preferably 3 to 45% by mass, more preferably 3 to 35% by mass, further preferably 3 to 20% by mass, based on 100 parts by mass in total of the prepolymer (P) and the thermosetting component. When the content of the epoxy resin falls within the range described above, heat resistance and curability tend to be further improved.

The resin composition of the present embodiment may be supplemented with an additional resin, in addition to the prepolymer (P) and the thermosetting component, as long as the intended characteristics are not impaired. The type of the additional resin is not particularly limited as long as the resin has insulating properties. Examples thereof include thermoplastic resins. Appropriately combined use with a thermoplastic resin or the like can confer characteristics such as metal adhesion and stress-relaxing properties.

[Inorganic Filler (D)]

The resin composition of the present embodiment preferably further comprises an inorganic filler (D).

The inorganic filler (D) used in the present embodiment is not particularly limited as long as the inorganic filler has insulating properties. Examples thereof include silicas (e.g., natural silica, fused silica, amorphous silica, and hollow silica), alumina, aluminum nitride, boron nitride, boehmite, molybdenum oxide, titanium oxide, zinc borate, zinc stannate, clay, kaolin, talc, fired clay, fired kaolin, fired talc, mica, short glass fiber (fine glass powders such as E glass and D glass), hollow glass, and spherical glass. These inorganic fillers may be used singly or in a form of a suitable mixture of two or more thereof.

Among them, silica is preferably used from the viewpoint of low thermal expansion. Alumina or aluminum nitride is preferably used from the viewpoint of high thermal conductivity.

In the resin composition of the present embodiment, the content of the inorganic filler (D) is not particularly limited and is preferably 50 to 500 parts by mass based on 100 parts by mass in total of the prepolymer (P) and the thermosetting component in view of characteristics such as low thermal expansion and high thermal conductivity. Among others, the content of the inorganic filler (D) is more preferably 100 to 300 parts by mass, further preferably 100 to 250 parts by mass.

[Cyanic Acid Ester Compound]

The resin composition of the present embodiment preferably comprises a cyanic acid ester compound as a thermosetting component.

Examples of the type of the cyanic acid ester compound used in the present embodiment include, but are not particularly limited to, a naphthol aralkyl-based cyanic acid ester represented by following general formula (7) given below, a novolac-based cyanic acid ester represented by following general formula (8) given below, biphenyl aralkyl-based cyanic acid esters, bis(3,3-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl) ether, bis(4-cyanatophenyl) thioether, bis(4-cyanatophenyl)sulfone, 2,2-bis(4-cyanatophenyl)propane, and prepolymers thereof. These cyanic acid ester compounds may be used singly or may be used in combinations of two or more thereof.

Among them, a naphthol aralkyl-based cyanic acid ester compound represented by following general formula (7), a novolac-based cyanic acid ester represented by following general formula (8), or a biphenyl aralkyl-based cyanic acid ester is particularly preferred because of excellent flame retardancy, high curability, and the low coefficient of thermal expansion of a cured product.

(7)

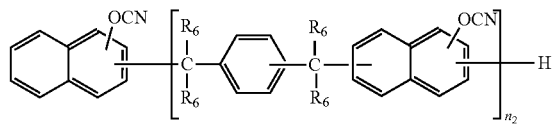

In the formula (7), each $R_6$ independently represents a hydrogen atom or a methyl group and is particularly preferably a hydrogen atom.

In the formula (7), $n_2$ represents an integer of 1 or larger. The upper limit of $n_2$ is preferably 10, more preferably 6.

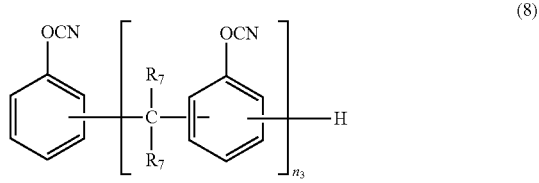

(8)

In the formula (8), each $R_7$ independently represents a hydrogen atom or a methyl group and is particularly preferably a hydrogen atom.

In the formula (8), $n_3$ represents an integer of 1 or larger. The upper limit of $n_3$ is preferably 10, more preferably 7.

Methods for producing these cyanic acid ester compounds are not particularly limited, and the cyanic acid ester compound used in the present embodiment may be produced by any method existing as a cyanic acid ester synthesis method. As a specific example, the cyanic acid ester compound can be obtained by reacting a naphthol aralkyl-based phenol resin represented by following general formula (9) given below with cyanogen halide in the presence of a basic compound in an inert organic solvent. An alternate method that may be adopted involves forming a salt of a similar naphthol aralkyl-based phenol resin and a basic compound in a solution containing water, followed by two-phase interfacial reaction with cyanogen halide for synthesis.

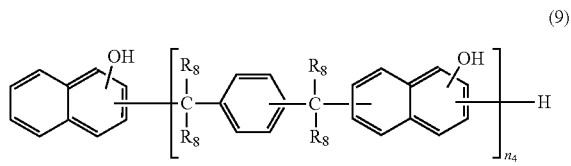

(9)

In the formula (9), each $R_8$ independently represents a hydrogen atom or a methyl group and is particularly preferably a hydrogen atom.

In the formula (9), $n_4$ represents an integer of 1 or larger. The upper limit of $n_4$ is preferably 10, more preferably 6.

The naphthol aralkyl-based cyanic acid ester compound can be selected from those obtained by condensing cyanic acid with a naphthol aralkyl resin obtained through the reaction of a naphthol such as α-naphthol or β-naphthol with p-xylylene glycol, α,α'-dimethoxy-p-xylene, 1,4-di(2-hydroxy-2-propyl)benzene, or the like.

In the resin composition of the present embodiment, the content of the cyanic acid ester compound is preferably 0.1 to 10 parts by mass, more preferably 0.1 to 5 parts by mass, further preferably 0.3 to 3 parts by mass, based on 100 parts by mass in total of the prepolymer (P) and the thermosetting component. The content of the cyanic acid ester compound falls within such a range, whereby the resulting printed circuit board can be excellent in moldability even when packed with a filler, and be excellent in elastic modulus under heat, desmear resistance, and chemical resistance.

[Silane Coupling Agent and/or Wetting Dispersant]

The resin composition of the present embodiment may be used in combination with a silane coupling agent and/or a wetting dispersant in order to improve the dispersibility of fine particles and the adhesion strength between the resin and the fine particles or glass cloth. The silane coupling agent is not particularly limited as long as the silane coupling agent is generally used in the surface treatment of inorganic matter. Specific examples thereof include: aminosilane derivatives such as γ-aminopropyltriethoxysilane and N-β-(aminoethyl)-γ-aminopropyltrimethoxysilane; epoxysilane derivatives such as γ-glycidoxypropyltrimethoxysilane; acrylsilane derivatives such as γ-acryloxypropyltrimethoxysilane; cationic silane derivatives such as N-β-(N-vinylbenzylaminoethyl)-γ-aminopropyltrimethoxysilane hydrochloride; and phenylsilane derivatives. These silane coupling agents may be used singly or in suitable combinations of two or more thereof. The wetting dispersant is not particularly limited as long as the wetting dispersant is used as a dispersion stabilizer for paint. Examples of the wetting dispersant include DISPER-110, -111, -118, -180, and -161, BYK-W996, -W9010, and -W903 manufactured by BYK Japan K.K.

[Curing Accelerator]

The resin composition of the present embodiment may be used in combination with a curing accelerator as long as the curing accelerator does not impair intended characteristics. Examples of the curing accelerators include, but are not particularly limited to: organic peroxides such as benzoyl peroxide, lauroyl peroxide, acetyl peroxide, p-chlorobenzoyl peroxide, and di-tert-butyl-di-perphthalate; azo compounds such as azobisnitrile; tertiary amines such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; organic metal salts such as lead naphthenate, lead stearate, zinc naphthenate, zinc octoate, tin oleate, dibutyl tin maleate, manganese naphthenate, cobalt naphthenate, and acetyl acetone iron; these organic metal salts dissolved in hydroxy group-containing compounds such as phenol and bisphenol; inorganic metal salts such as tin chloride, zinc chloride, and aluminum chloride; dioctyl tin oxide and other organic tin compounds such as alkyl tin and alkyl tin oxide, and triphenylimidazole (TPIZ).

[Organic Solvent]

The resin composition of the present embodiment may further comprise a solvent, if necessary. For example, use of an organic solvent reduces viscosity during the preparation of the resin composition and thus improves handleability while enhancing the impregnation of glass cloth with the resin composition. The type of the solvent is not particularly limited as long as the solvent is capable of dissolving a portion or the whole of the resins in the resin composition. Specific examples thereof include, but are not particularly limited to: ketones such as acetone, methyl ethyl ketone, and methylcellosolve; aromatic hydrocarbons such as toluene and xylene; amides such as dimethylformamide; and propylene glycol monomethyl ether and its acetate. These solvents can be used singly or in combinations of two or more thereof.

[Silicone Powder]

The resin composition of the present embodiment may comprise a silicone powder. The silicone powder acts as a flame retardant promoter that delays a combustion time and enhances a flame retardant effect.

Examples of the silicone powder include, but are not particularly limited to: a fine powder of polymethylsilsesquioxane with three-dimensionally crosslinked networks of siloxane bonds; a fine powder of an addition polymer of vinyl group-containing dimethylpolysiloxane and methyl hydrogen polysiloxane; a fine powder that is composed of an addition polymer of vinyl group-containing dimethylpolysiloxane and methyl hydrogen polysiloxane and is covered at its surface with polymethylsilsesquioxane with three-dimensionally crosslinked networks of siloxane bonds; and an inorganic carrier covered at its surface with polymethylsilsesquioxane with three-dimensionally crosslinked networks of siloxane bonds. These silicone powders are commercially available as silicone rubber powders and silicone composite powders.

The average particle size (D50) of the silicone powder is not particularly limited. The average particle size (D50) is preferably 1 to 15 μm in consideration of dispersibility.

In the resin composition of the present embodiment, the content of the silicone powder is preferably 3 to 120 parts by mass based on 100 parts by mass in total of the prepolymer (P) and the thermosetting component. Too large a content of the silicone powder may reduce moldability or dispersibility. Therefore, the content of the silicone powder is particularly preferably 3 to 60 parts by mass.

[Other Components]

The resin composition of the present embodiment may be used in combination with any of various polymer compounds such as other thermosetting resins, thermoplastic resins and oligomers thereof, and elastomers, other flame retardant compounds, additives, etc., as long as the intended characteristics are not impaired. These components are not particularly limited as long as the components are generally used. Examples of the flame retardant compounds include nitrogen-containing compounds such as melamine and benzoguanamine, and oxazine ring-containing compounds. Examples of the additives include ultraviolet absorbers, antioxidants, photopolymerization initiators, fluorescent whitening agents, photosensitizers, dyes, pigments, thickeners, lubricants, antifoaming agents, surface conditioners, brightening agents, and polymerization inhibitors. These additives may be used in appropriate combinations, if desired.

[Method for Producing Resin Composition]

The method for producing the resin composition of the present embodiment comprises the steps of:

obtaining a prepolymer (P) by polymerizing an alkenyl-substituted nadimide (A), a maleimide compound (B), and an amino-modified silicone (C); and mixing the obtained prepolymer (P) with a thermosetting component.

In the step of obtaining a prepolymer (P), the components (A) to (C) may be polymerized at the same time or may be polymerized in arbitrary combinations. It is preferred to obtain a primary prepolymer by polymerizing the component (B) with the component (C) and then obtain a secondary prepolymer by polymerizing the primary prepolymer with the component (A), because such a process has a tendency to improve peel strength, improve desmear resistance, improve moldability, or suppress the bleedout of silicone components.

In the step of mixing the obtained prepolymer (P) with a thermosetting component, other optional components may be mixed therewith, if necessary.

The components (A) to (C), the thermosetting component, and the optional components used in the method for producing the resin composition of the present embodiment are as described in the paragraphs about the resin composition.

An organic solvent can be used, if necessary, in the production of the resin composition of the present embodiment. The type of the organic solvent is not particularly limited as long as the solvent is capable of dissolving the resins in the resin composition. Specific examples thereof are as listed above.

Treatment (stirring, mixing, or kneading treatment, etc.) known in the art for uniformly dissolving or dispersing each component can be carried out in the production of the resin composition of the present embodiment. In the case of using, for example, the inorganic filler (D), the inorganic filler (D) can be uniformly dispersed by stirring and dispersing treatment using a stirring vessel equipped with a stirrer having an appropriate stirring ability. This enhances the dispersibility of the inorganic filler (D) in the resin composition. The stirring, mixing, or kneading treatment can be appropriately carried out using an apparatus known in the art such as an apparatus aimed at mixing, for example, a ball mill or a bead mill, or a revolution- or rotation-type mixing apparatus.

[Prepreg]

The prepreg of the present embodiment is a prepreg comprising a base material impregnated or coated with the resin composition described above.

The prepreg of the present embodiment can be obtained, for example, by combining the resin composition with the base material, specifically, impregnating or coating the base material with the resin composition. The method for producing the prepreg of the present embodiment can be carried out according to a routine method without particular limitations. Examples thereof include a method which involves impregnating or coating the base material with the resin composition, followed by semi-curing (conversion to B-stage) by heating or the like for 1 to 30 minutes in a drier of 100 to 200° C. to obtain the prepreg. The amount of the resin composition (comprising the inorganic filler) in the prepreg of the present embodiment is not particularly limited and is preferably in the range of 30 to 90% by mass based on the total mass of the prepreg.

The base material for use in the prepreg of the present embodiment is not particularly limited and can be appropriately selected for use from various printed circuit board materials known in the art according to the intended use or performance. Specific examples thereof include, but are not particularly limited to: glass fibers such as E glass, D glass, S glass, Q glass, spherical glass, NE glass, and T glass; non-glass inorganic fibers such as quartz; wholly aromatic polyamides such as poly-p-phenyleneterephthalamide (Kevlar®, manufactured by Du Pont K.K.) and co-poly-p-phenylene/3,4'-oxydiphenylene/terephthalamide (Technora®, manufactured by Teijin Techno Products, Ltd.); polyesters such as 2,6-hydroxynaphthoic acid/p-hydroxybenzoic acid (Vectran®, manufactured by Kuraray Co., Ltd.); and organic fibers such as poly-p-phenylene benzoxazole (Zylon®, manufactured by Toyobo Co., Ltd.) and polyimide.

Among them, E glass cloth, T glass cloth, S glass cloth, Q glass cloth, or an organic fiber is preferred from the viewpoint of low thermal expansion.

These base materials can be used singly or in combinations of two or more thereof.

Examples of the form of the base material include, but are not particularly limited to, woven fabrics, nonwoven fabrics, lobings, chopped strand mats, and surfacing mats. The textures of the woven fabrics are not particularly limited, and, for example, plain weave, mat weave, and twill weave are known. The base material can be appropriately selected for use from these materials known in the art according to the intended use or performance. Such a base material subjected to opening treatment or a glass woven fabric surface-treated with a silane coupling agent or the like is preferably used. The base material is not particularly limited by its thickness and mass. Usually, the base material of approximately 0.01 to 0.3 mm is preferably used. In particular, the base material is preferably a glass woven fabric having a thickness of 200 μm or smaller and a mass of 250 g/m$^2$ or smaller, more preferably a glass woven fabric made of E glass, S glass, or T glass fiber, from the viewpoint of strength and water absorbability.

[Laminate Comprising Prepreg]

The laminate of the present embodiment can be obtained, for example, by curing one or more layers of the prepreg mentioned above.

Also, the metal foil-clad laminate of the present embodiment can be obtained, for example, by curing a metal foil laminated with the prepreg mentioned above.

Specifically, the metal foil-clad laminate of the present embodiment can be obtained, for example, by providing at least one or more layers of the prepreg mentioned above and disposing the metal foil on one side or both sides thereof, followed by lamination molding. More specifically, the metal foil-clad laminate can be produced by providing one layer or two or more layers of the prepreg mentioned above, disposing the metal (e.g., copper or aluminum) foil on one side or both sides thereof as desired, and lamination-molding this construct according to the need. In this context, the metal foil used is not particularly limited as long as the metal foil can be used as a printed circuit board material. A copper foil known in the art such as a rolled copper foil or an electrolytic copper foil is preferred. The thickness of the metal foil is not particularly limited and is preferably 1 to 70 μm, more preferably 1.5 to 35 μm. The metal foil-clad laminate is not particularly limited by its molding method and molding conditions and can be molded by use of a general approach and conditions for laminates for printed circuit boards and multilayer boards. For example, a multiplaten press, a multiplaten vacuum press, a continuous molding machine, or an autoclave molding machine can be used in the molding of the metal foil-clad laminate. The metal foil-clad laminate is generally molded at a temperature of 100 to 300° C. and a pressure of 2 to 100 kgf/cm$^2$ in terms of surface pressure for a heating time in the range of 0.05 to 5 hours. If necessary, post curing may be further carried out at a temperature of 150 to 300° C. Alternatively, the prepreg mentioned above may be lamination-molded in combination with a separately prepared wiring board for an inner layer to obtain a multilayer board.

The metal foil-clad laminate of the present embodiment can be preferably used as a printed circuit board by forming a predetermined wiring pattern. In addition, the metal foil-clad laminate of the present embodiment has a low coefficient of thermal expansion and favorable moldability, metal foil peel strength, and chemical resistance (particularly, desmear resistance) and can thus be used particularly effectively as a printed circuit board for semiconductor packages required to have such performance.

In the present embodiment, the form of the prepreg mentioned above as well as the form of an embedded sheet comprising a metal foil or a film coated with the resin composition mentioned above may be used.

[Resin Sheet]

The resin sheet of the present embodiment is a resin sheet comprising a support coated on one side or both sides with the resin composition mentioned above. In this context, the resin sheet is used as an approach for thinning and can be produced, for example, by directly coating a support such as a metal foil or a film with a thermosetting resin (containing an inorganic filler) for use in prepregs, etc., followed by drying.

The support for use in the production of the resin sheet of the present embodiment is not particularly limited, and any of various printed circuit board materials known in the art can be used. Examples thereof include polyimide films, polyamide films, polyester films, polyethylene terephthalate (PET) films, polybutylene terephthalate (PBT) films, polypropylene (PP) films, polyethylene (PE) films, aluminum foils, copper foils, and gold foils. Among them, an electrolytic copper foil or a PET film is preferred.

The resin sheet of the present embodiment is particularly preferably a product obtained by coating the support with the aforementioned resin composition, followed by semi-curing (conversion to B-stage). The method for producing this resin sheet of the present embodiment is generally preferably a method for producing a composite of a B-stage resin and a support. Specific examples thereof include a method which involves coating the support such as a copper foil with the resin composition, followed by semi-curing by a method such as heating for 1 to 60 minutes in a drier of 100 to 200° C. to produce the resin sheet. The amount of the resin composition applied to the support is preferably in the range of 1 to 300 μm in terms of the resin thickness of the resin sheet.

The resin sheet of the present embodiment can be used as a buildup material for printed circuit boards.

[Laminate Comprising Resin Sheet]

The laminate of the present embodiment can be obtained, for example, by curing one or more layers of the resin sheet mentioned above.

Also, the metal foil-clad laminate of the present embodiment can be obtained, for example, by curing a metal foil laminated with the resin sheet mentioned above.

Specifically, the metal foil-clad laminate of the present embodiment can be obtained, for example, by using the resin sheet mentioned above and disposing the metal foil on one side or both sides thereof, followed by lamination molding. More specifically, the metal foil-clad laminate can be produced, for example, by providing one layer of the resin sheet mentioned above or two or more layers of the resin sheet separated from its support as desired, disposing the metal (e.g., copper or aluminum) foil on one side or both sides thereof, and lamination-molding this construct according to the need. In this context, the metal foil used is not particularly limited as long as the metal foil can be used as a printed circuit board material. A copper foil known in the art such as a rolled copper foil or an electrolytic copper foil is preferred. The metal foil-clad laminate is not particularly limited by its molding method and molding conditions and can be molded by use of a general approach and conditions for laminates for printed circuit boards and multilayer boards. For example, a multiplaten press, a multiplaten vacuum press, a continuous molding machine, or an autoclave molding machine can be used in the molding of the metal foil-clad laminate. The metal foil-clad laminate is generally molded at a temperature of 100 to 300° C. and a pressure of 2 to 100 kgf/cm$^2$ in terms of surface pressure for a heating time in the range of 0.05 to 5 hours. If necessary, post curing may be further carried out at a temperature of 150 to 300° C.

[Laminate Comprising Resin Sheet and Prepreg]

The laminate of the present embodiment may be a laminate obtained by curing one or more layers of a resin sheet and one or more layers of a prepreg or may be a metal foil-clad laminate obtained by curing a metal foil laminated with a resin sheet and a prepreg.

When the form of a metal foil-clad laminate is not adopted in the present embodiment, an electroless plating approach may be used for forming a conductor layer that serves as a circuit and preparing a printed circuit board.

[Printed Circuit Board]

The printed circuit board of the present embodiment is a printed circuit board comprising an insulating layer and a conductor layer formed on a surface of the insulating layer, wherein the insulating layer comprises the resin composition mentioned above.

The printed circuit board of the present embodiment is prepared, for example, by forming a conductor layer that serves as a circuit by use of a metal foil or electroless plating on the insulating layer. The conductor layer is generally constituted by copper or aluminum. The insulating layer for printed circuit boards with the conductor layer formed thereon can be preferably used as a printed circuit board by forming a predetermined wiring pattern. In addition, the printed circuit board of the present embodiment comprising the insulating layer comprising the resin composition mentioned above can be particularly effectively used as a printed circuit board for semiconductor packages, because the insulating layer mentioned above maintains the excellent elastic modulus even at a reflow temperature during semiconductor packaging to thereby effectively suppress the warpage of semiconductor plastic packages, and also offers excellent metal foil peel strength and desmear resistance.

Specifically, the printed circuit board of the present embodiment can be produced by, for example, the following method: first, the metal foil-clad laminate (copper-clad laminate, etc.) mentioned above is prepared. The surface of the metal foil-clad laminate is subjected to etching treatment for the formation of an inner layer circuit to prepare an inner layer substrate. The inner layer circuit surface of this inner layer substrate is subjected, if necessary, to surface treatment for enhancing adhesion strength. Subsequently, a required number of the prepreg mentioned above is laminated on the resulting inner layer circuit surface. A metal foil for an outer layer circuit is laterally laminated thereon, followed by integral molding under heat and pressure. In this way, a multilayer laminate is produced in which the insulating layer composed of the base material and a cured product of thermosetting resin composition is formed between the inner layer circuit and the metal foil for an outer layer circuit. Subsequently, this multilayer laminate is processed by hole drilling for through-holes or via holes and then subjected to desmear treatment for removing smear, which is a residue of resins derived from the resin components contained in the cured product layer. Then, the inside walls of these holes are coated with a metal plating film for the community between the inner layer circuit and the metal foil for an outer layer circuit. The metal foil for an outer layer circuit is further subjected to etching treatment for the formation of the outer layer circuit to produce the printed circuit board.

In the printed circuit board of the present embodiment, for example, the prepreg mentioned above (base material impregnated with the resin composition mentioned above), the resin sheet mentioned above (support impregnated with the resin composition mentioned above), or the resin composition layer of the metal foil-clad laminate (layer composed of the resin composition mentioned above) constitutes the insulating layer comprising the resin composition mentioned above.

In the printed circuit board of the present embodiment, the insulating layer has a difference of preferably 20% or less, more preferably 0 to 20%, further preferably 0 to 15%, between the flexural modulus at 25° C. and the flexural modulus under heat at 250° C. When the insulating layer has the difference between the flexural modulus at 25° C. and the flexural modulus under heat at 250° C. within the range described above, the rate of maintenance of elastic modulus is favorable. In this context, the rate of maintenance of elastic modulus refers to the ratio of the flexural modulus at 250° C. to the flexural modulus at 25° C.

In the present embodiment, examples of the approach for setting the difference between the flexural modulus at 25° C. and the flexural modulus under heat at 250° C. of the insulating layer to within 20% include, but are not particularly limited to, appropriately adjusting the type and content of each component in the resin composition for use in the insulating layer to the ranges described above.

EXAMPLES

Hereinafter, the present invention will be specifically described with reference to Examples and Comparative Examples. However, the present invention is not intended to be limited by these Examples by any means.

Example 1

18 parts by mass of a maleimide compound (BMI-80, maleimide group equivalent: 285 g/eq, manufactured by K-I Chemical Industry Co., LTD.) were polymerized with 12 parts by mass of diamino-modified silicone (X-22-161B, amino group equivalent: 1500 g/eq, manufactured by Shin-Etsu Chemical Co., Ltd.) to obtain a primary prepolymer. The obtained primary prepolymer was polymerized with 16 parts by mass of bisallylnadimide (BANI-M, alkenyl group equivalent: 286 g/eq, manufactured by Maruzen Petrochemical Co., Ltd.) to obtain a secondary prepolymer. The obtained secondary prepolymer, 32 parts by mass of a maleimide compound (BMI-2300, maleimide group equivalent: 186 g/eq, manufactured by Daiwa Fine Chemicals Co., Ltd.), 16 parts by mass of bisallylnadimide (BANI-M, alkenyl group equivalent: 286 g/eq, manufactured by Maruzen Petrochemical Co., Ltd.), 6 parts by mass of a biphenyl aralkyl-based epoxy resin (NC-3000H, manufactured by Nippon Kayaku Co., Ltd.), 160 parts by mass of slurry silica (SC-2050 MB, manufactured by Admatechs Co., Ltd.), 2 parts by mass of an epoxysilane coupling agent (KBM-403, manufactured by Shin-Etsu Chemical Co., Ltd.), 1 part by mass of a styrylsilane coupling agent (KBM-1403, manufactured by Shin-Etsu Chemical Co., Ltd.), 1 part by mass of a wetting dispersant (DISPERBYK-161, manufactured by BYK Japan K.K.), and 0.5 parts by mass of a curing accelerator (TPIZ, manufactured by Wako Pure Chemical Industries, Ltd.) were mixed to obtain a resin composition having a ratio of the number of maleimide groups/the number of amino groups of 7.9 and a ratio of the number of alkenyl groups/the number of maleimide groups of 2.3.

In the present Examples, the number of maleimide groups/the number of amino groups and the number of alkenyl groups/the number of maleimide groups are represented by the following expressions: [The number of maleimide groups/the number of amino groups]=(Parts by mass of the maleimide compound/Maleimide group equivalent of the maleimide compound)/(Parts by mass of the diamino-modified silicone/Amino group equivalent of the diamino-modified silicone) [The number of alkenyl groups/the number of maleimide groups]=(Parts by mass of the bisallylnadimide/Alkenyl group equivalent of the bisallylnadimide)/(Parts by mass of the maleimide compound/Maleimide group equivalent of the maleimide compound)

The obtained resin composition was diluted with methyl ethyl ketone to obtain varnish. A T glass cloth (T2118) was impregnated and coated with this varnish, and dried by heating at 160° C. for 3 minutes to obtain a prepreg having a resin composition content of 46.5% by mass.

Example 2

18 parts by mass of a maleimide compound (BMI-80, maleimide group equivalent: 285 g/eq, manufactured by K-I Chemical Industry Co., LTD.) were polymerized with 12 parts by mass of diamino-modified silicone (X-22-161B, amino group equivalent: 1500 g/eq, manufactured by Shin-Etsu Chemical Co., Ltd.) to obtain a primary prepolymer. The obtained primary prepolymer was polymerized with 32 parts by mass of bisallylnadimide (BANI-M, alkenyl group equivalent: 286 g/eq, manufactured by Maruzen Petrochemical Co., Ltd.) to obtain a secondary prepolymer. The obtained secondary prepolymer, 32 parts by mass of a maleimide compound (BMI-2300, maleimide group equivalent: 186 g/eq, manufactured by Daiwa Fine Chemicals Co., Ltd.), 6 parts by mass of a biphenyl aralkyl-based epoxy resin (NC-3000H, manufactured by Nippon Kayaku Co., Ltd.), 160 parts by mass of slurry silica (SC-2050 MB, manufactured by Admatechs Co., Ltd.), 2 parts by mass of an epoxysilane coupling agent (KBM-403, manufactured by Shin-Etsu Chemical Co., Ltd.), 1 part by mass of a styrylsilane coupling agent (KBM-1403, manufactured by Shin-Etsu Chemical Co., Ltd.), 1 part by mass of a wetting dispersant (DISPERBYK-161, manufactured by BYK Japan K.K.), and 0.5 parts by mass of a curing accelerator (TPIZ, manufactured by Wako Pure Chemical Industries, Ltd.) were mixed to obtain a resin composition having a ratio of the number of maleimide groups/the number of amino groups of 7.9 and a ratio of the number of alkenyl groups/the number of maleimide groups of 2.1. The obtained resin composition was diluted with methyl ethyl ketone to obtain varnish. A T glass cloth (T2118) was impregnated and coated with this varnish, and dried by heating at 160° C. for 3 minutes to obtain a prepreg having a resin composition content of 46.5% by mass.

Comparative Example 1

18 parts by mass of a maleimide compound (BMI-80, maleimide group equivalent: 285 g/eq, manufactured by K-I Chemical Industry Co., LTD.) were polymerized with 12 parts by mass of diamino-modified silicone (X-22-161B, amino group equivalent: 1500 g/eq, manufactured by Shin-Etsu Chemical Co., Ltd.) to obtain a primary prepolymer. The obtained primary prepolymer, 32 parts by mass of a maleimide compound (BMI-2300, maleimide group equivalent: 186 g/eq, manufactured by Daiwa Fine Chemicals Co., Ltd.), 32 parts by mass of bisallylnadimide (BANI-M, alkenyl group equivalent: 286 g/eq, manufactured by Maruzen Petrochemical Co., Ltd.), 6 parts by mass of a biphenyl aralkyl-based epoxy resin (NC-3000H, manufactured by Nippon Kayaku Co., Ltd.), 160 parts by mass of slurry silica (SC-2050 MB, manufactured by Admatechs Co., Ltd.), 2 parts by mass of an epoxysilane coupling agent (KBM-403, manufactured by Shin-Etsu Chemical Co., Ltd.), 1 part by mass of a styrylsilane coupling agent (KBM-1403, manufactured by Shin-Etsu Chemical Co., Ltd.), 1 part by mass of a wetting dispersant (DISPERBYK-161, manufactured by BYK Japan K.K.), and 0.5 parts by mass of a curing accelerator (TPIZ, manufactured by Wako Pure Chemical Industries, Ltd.) were mixed to obtain a resin composition having a ratio of the number of maleimide groups/the number of amino groups of 7.9 and a ratio of the number of alkenyl groups/the number of maleimide groups of 2.1. The obtained resin composition was diluted with methyl ethyl ketone to obtain varnish. A T glass cloth (T2118) was impregnated and coated with this varnish, and dried by heating at 160° C. for 3 minutes to obtain a prepreg having a resin composition content of 46.5% by mass.

[Preparation of Metal Foil-Clad Laminate]

Electrolytic copper foils having a thickness of 12 μm (3EC-III, manufactured by Mitsui Mining & Smelting Co., Ltd.) were disposed on the upper and lower sides of 1 layer of the prepreg obtained in each of Example 1, Example 2, and Comparative Example 1, and the resultant was lamination-molded at a pressure of 30 kgf/cm² and a temperature of 220° C. for 120 minutes to obtain a copper-clad laminate having an insulating layer thickness of 0.1 mm.

Results of measuring a copper foil peel strength and desmear resistance using each obtained copper-clad laminate are shown in Table 1.

[Method for Evaluating Physical Properties of Copper-Clad Laminate]

Copper foil peel strength: a test specimen (30 mm×150 mm×0.1 mm) with a 12 μm copper foil was used to measure copper foil peel strength according to JIS C6481.

Desmear resistance: in order to evaluate chemical resistance in the desmear step, the copper foils were removed from each copper-clad laminate prepared as described above by etching. Then, the resulting sample was dipped in a swelling solution (manufactured by Atotech Japan K.K., "Swelling Dip Securiganth P") at 80° C. for 10 minutes, then dipped in a roughening solution (manufactured by Atotech Japan K.K., "Concentrate Compact CP") at 80° C. for 5 minutes, and finally dipped in a neutralizing solution (manufactured by Atotech Japan K.K., "Reduction Conditioner Securiganth P500") at 45° C. for 10 minutes. The amount of decrease in mass (% by mass) between before and after the treatment was determined. This experiment was carried out in triplicate. The arithmetic average of the rates of decrease in mass in the 3 runs of the experiment was used as an evaluation value.

TABLE 1

| | | Example 1 | Example 2 | Comparative Example 1 |
|---|---|---|---|---|
| Copper foil peel strength | [kgf/cm] | 0.41 | 0.45 | 0.23 |
| Desmear resistance, rate of decrease in mass 0.1 t c/c | [%] | −1.52 | −1.42 | −1.88 |

INDUSTRIAL APPLICABILITY

The resin composition of the present invention and the printed circuit board comprising the resin composition can be preferably used as members for various electronics and communication devices, including personal computers.

The invention claimed is:

1. A resin composition comprising a prepolymer (P) and a thermosetting component, the prepolymer (P) being obtained by polymerizing an alkenyl-substituted nadimide (A), a maleimide compound (B-1), and an amino-modified silicone (C);

wherein the maleimide compound (B-1) is at least one compound selected from the group consisting of 2,2- bis(4-(4-maleimidophenoxy)-phenyl)propane and bis(3-ethyl-5-methyl-4-maleimidophenyl)methane,
wherein the thermosetting component comprises an alkenyl-substituted nadimide (A) and/or a maleimide compound (B-2), and
wherein the maleimide compound (B-2) is at least one compound selected from the group consisting of polytetramethylene oxide-bis(4-maleimidobenzoate) and a maleimide compound represented by formula (6):

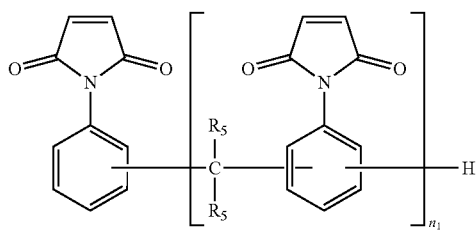

(6)

wherein each $R_5$ independently represents a hydrogen atom or a methyl group, and $n_1$ represents an integer of 1 or larger.

2. The resin composition according to claim 1, wherein the alkenyl-substituted nadimide (A) comprises a compound represented by following formula (1):

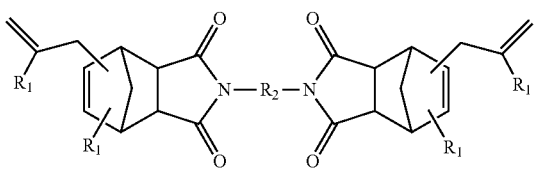

(1)

wherein each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by following formula (2) or (3):

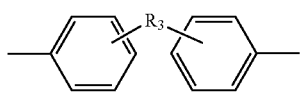

(2)

wherein $R_3$ represents a methylene group, an isopropylidene group, or a substituent represented by CO, O, S, or $SO_2$, and

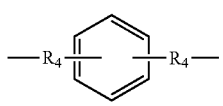

(3)

wherein each $R_4$ independently represents an alkylene group having 1 to 4 carbon atoms, or a cycloalkylene group having 5 to 8 carbon atoms.

3. The resin composition according to claim 1, wherein the alkenyl-substituted nadimide (A) comprises a compound represented by the following formula (4) and/or a compound represented by the following formula (5):

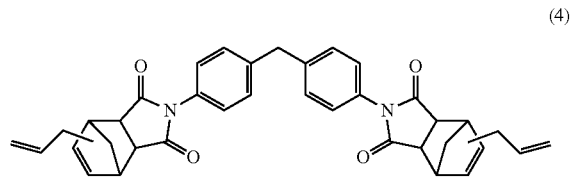

(4)

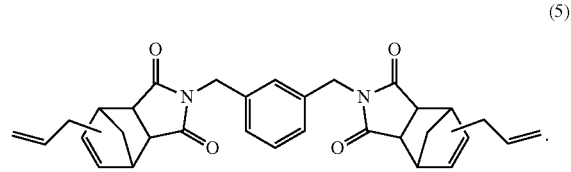

(5)

4. The resin composition according to claim 1, wherein the amino-modified silicone (C) comprises a compound represented by following formula (Y):

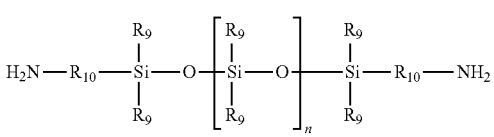

(Y)

wherein each $R_9$ independently represents a hydrogen atom, a methyl group, or a phenyl group, each $R_{10}$ independently represents an alkylene group having 1 to 10 carbon atoms and optionally having a side chain, and n represents an integer of 0 or larger.

5. The resin composition according to claim 1, further comprising an inorganic filler (D).

6. The resin composition according to claim 5, wherein the inorganic filler (D) comprises at least one selected from the group consisting of silica, alumina, and aluminum nitride.

7. The resin composition according to claim 5, wherein the content of the inorganic filler (D) is 50 to 500 parts by mass based on 100 parts by mass in total of the prepolymer (P) and the thermosetting component.

8. A metal foil-clad laminate comprising a cured product of a laminated body comprising a metal foil laminated with at least one selected from the group consisting of a prepreg comprising a base material impregnated or coated with the resin composition according to claim 1 and a resin sheet comprising a support coated with the resin composition.

9. A printed circuit board comprising an insulating layer and a conductor layer formed on the surface of the insulating layer, wherein the insulating layer comprises the resin composition according to claim 1.

10. A method for producing a resin composition, comprising:
obtaining a prepolymer (P) by polymerizing an alkenyl-substituted nadimide (A), a maleimide compound (B-1), and an amino-modified silicone (C),
wherein the maleimide compound (B-1) is at least one compound selected from the group consisting of 2,2- bis(4-(4-maleimidophenoxy)-phenyl)propane and bis(3-ethyl-5-methyl-4-maleimidophenyl)methane; and
mixing the obtained prepolymer (P) with a thermosetting component;
wherein the thermosetting component comprises an alkenyl-substituted nadimide (A) and/or a maleimide compound (B-2),
wherein the maleimide compound (B-2) is at least one compound selected from the group consisting of polytetramethylene oxide-bis(4-maleimidobenzoate) and a maleimide compound represented by formula (6):

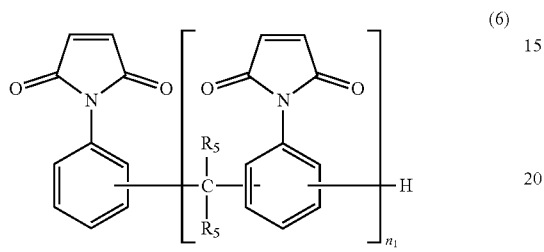

(6)

wherein each $R_5$ independently represents a hydrogen atom or a methyl group, and $n_1$ represents an integer of 1 or larger.

* * * * *